(12) United States Patent
Zitlaw

(10) Patent No.: US 7,386,657 B2
(45) Date of Patent: Jun. 10, 2008

(54) RANDOM ACCESS INTERFACE IN A SERIAL MEMORY DEVICE

(75) Inventor: Cliff Zitlaw, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/811,493

(22) Filed: Jun. 11, 2007

(65) Prior Publication Data

US 2007/0245071 A1  Oct. 18, 2007

Related U.S. Application Data

(63) Continuation of application No. 11/415,490, filed on May 1, 2006, now Pat. No. 7,240,146, which is a continuation of application No. 10/682,674, filed on Oct. 9, 2003, now Pat. No. 7,073,016.

(51) Int. Cl.
   *G06F 12/00* (2006.01)
(52) U.S. Cl. ........................ 711/103; 711/105
(58) Field of Classification Search ...................... None
   See application file for complete search history.

(56) References Cited

U.S. PATENT DOCUMENTS

| | | | |
|---|---|---|---|
| 5,657,289 A | 8/1997 | Hush | |
| 5,717,647 A | 2/1998 | Hush | |
| 5,768,178 A | 6/1998 | McLaury | |
| 6,275,886 B1 | 8/2001 | Levy | |
| 6,331,960 B1 | 12/2001 | Miyamoto | |
| 6,405,297 B1 | 6/2002 | Morgan | |
| 6,571,367 B1 | 5/2003 | Mano | |
| 6,725,321 B1 | 4/2004 | Sinclair et al. | |
| 7,073,016 B2 * | 7/2006 | Zitlaw | ........................ 711/103 |
| 2002/0138702 A1 | 9/2002 | Gefen et al. | |
| 2004/0017708 A1 | 1/2004 | Choi et al. | |
| 2004/0076069 A1 | 4/2004 | Voth et al. | |

* cited by examiner

*Primary Examiner*—Hiep T. Nguyen
(74) *Attorney, Agent, or Firm*—Leffert, Jay & Polglaze P.A.

(57) ABSTRACT

A random access interface is provided to a non-volatile, serial memory array. An address multiplexer has an external address connection and a serial address connection. The external address may be of a non-sequential nature, depending on the accessing instruction. Boot data is loaded from the first row of the memory array to a cache register. If a random access mode is enabled during a boot operation, the external address is applied to a data multiplexer that accesses the boot data from the cache register and executes the instructions.

19 Claims, 5 Drawing Sheets

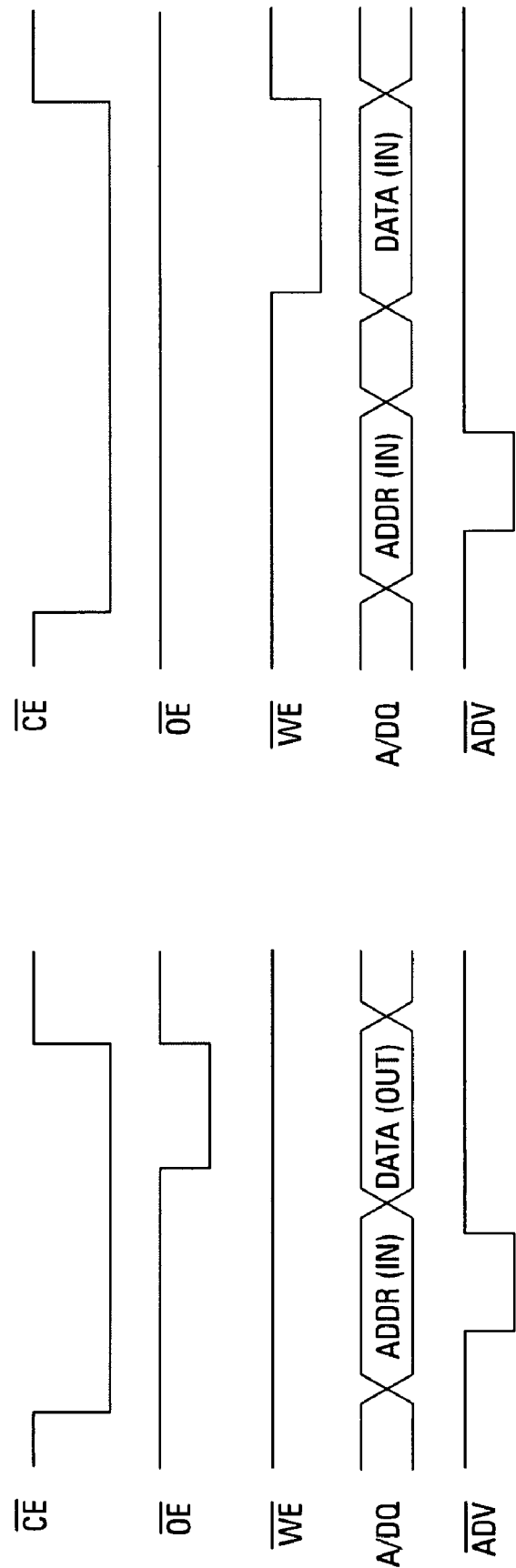

RANDOM ACCESS INTERFACE IN A SERIAL MEMORY DEVICE

RELATED APPLICATION

This Application is a continuation of U.S. application Ser. No. 11/415,490, titled "RANDOM ACCESS INTERFACE IN A SERIAL MEMORY DEVICE," filed May 1, 2006 (Allowed) now U.S. Pat. No. 7,240,146 which is a continuation of U.S. application Ser. No. 10/682,674, titled "RANDOM ACCESS INTERFACE IN A SERIAL MEMORY DEVICE," filed Oct. 9, 2003, now U.S. Pat. No. 7,073,016, which are commonly assigned and incorporated herein by reference.

TECHNICAL FIELD OF THE INVENTION

The present invention relates generally to memory devices and in particular the present invention relates to random access to serial memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Two common types of flash memory array architectures are the "NAND" and "NOR" architectures, so called for the logical form in which the basic memory cell configuration or each is arranged. In the NOR array architecture, the floating gate memory cells of the memory array are arranged in a matrix. The gates of each floating gate memory cell of the array matrix are coupled by rows to word select lines and their drains are coupled to column bit lines. The NOR architecture floating gate memory array is accessed by a row decoder activating a row of floating gate memory cells by selecting the word select line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line. The NAND architecture floating gate memory array is then accessed by a row decoder activating a row of floating gate memory cells by selecting the word select line coupled to their gates. In addition, the word lines coupled to the gates of the unselected memory cells of each group are driven to operate the unselected memory cells of each group as pass transistors, so that they pass current in a manner that is unrestricted by their stored data values. Current then flows from the source line to the column bit line through each series coupled group, restricted only by the selected memory cells of each group. This places the current encoded data values of the row of selected memory cells on the column bit lines.

The cost of NAND memories is significantly less than NOR devices of comparable density. This cost differential makes NAND devices increasingly attractive for embedded applications in which NOR devices are typically used. However, since NAND devices act serially, they cannot easily perform as boot memory in a computer system while the inherent random access nature of NOR memory makes them better suited to act as embedded boot memory.

For the reasons stated above, and for other reasons stated below which will become apparent to those skilled in the art upon reading and understanding the present specification, there is a need in the art for a NAND flash memory device that can perform as a boot memory device in a computer system.

BRIEF DESCRIPTION OF THE DRAWINGS

FIG. 5 shows one embodiment of a read timing diagram for the memory device with a random access interface of the present invention.

FIG. 6 shows one embodiment of a write timing diagram for the memory device with a random access interface of the present invention.

DETAILED DESCRIPTION

Figure 1:
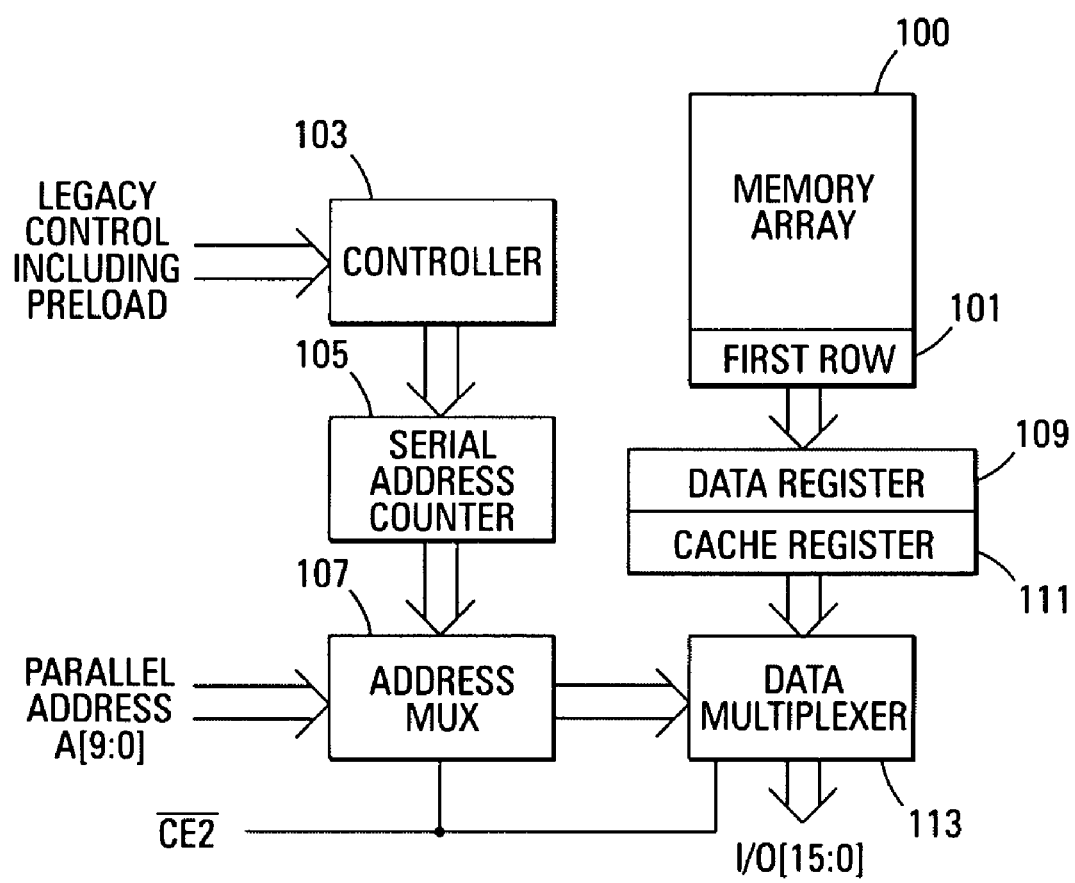
FIG. 1 shows a block diagram of one embodiment of a memory device of the present invention having a random access interface.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates a block diagram of one embodiment of the flash memory of the present invention having a random access interface. The memory is comprised of a memory array 100. In one embodiment, the memory array 100 has a NAND architecture. While the embodiments of the present invention are subsequently described with the NAND memory architecture, alternate embodiments may still operate properly using other types of flash memory architectures or other types of serial memory.

The memory array 100 includes a first row 101 that may also be referred to as the first page of the memory 100. In one embodiment, the first row 101 is 1024 words or 2048 bytes of data. Alternate embodiments have other row/page sizes.

At power-up of the memory device, the first row 101 can be automatically loaded from the memory array 100 to the data register 109. This loading operation is under control of the memory device's controller 103. The controller 103 may be a microcontroller, a sequencer, a processor, or some other type of controlling circuit embedded in the NAND device.

During a power-up sequence, the controller 103 activates the first row of the memory array 100. The controller 103 then loads and increments the serial address counter 105. The addresses generated by the serial address counter 105 are input to an address multiplexer 107 that selects between the address from the serial address counter 105 and an input parallel address that is described subsequently. The address output from the address multiplexer 107 is input to a data multiplexer 113.

In one embodiment, the input parallel address is a ten bit address (i.e., A[9:0]). Alternate embodiments may use other address lengths depending on the size of the data block to be read.

A cache register 111 is coupled to the data register 109. The cache register 111 acts as a ROM device and, in one embodiment, is large enough to accept the data from the first row 101 of the memory array 100. The data can then be randomly selected out of the cache register 111 with the data multiplexer 113 in response to the selected input address. While the data register 109 is being loaded from the memory array 100, the data multiplexer 113 can access data from the cache register 111, thereby increasing the speed of reading data out of the array 100. In one embodiment, the data multiplexer 113 outputs a sixteen bit data word (i.e., I/O[15:0]). Alternate embodiments use different word lengths and different cache register sizes. Alternate embodiments can write to the cache register 111 with the parallel addressing made possible by the present invention.

The random access function of the present invention is enabled by a select signal (CE2#) that is coupled to the address multiplexer 107 and the data multiplexer 113. The select signal (CE2#) selects between the serial address counter 105 during normal operation and the external parallel address value when a random access to the cache register 111 is required.

The select signal (CE2#) also enables the data multiplexer 113 to select between the data input during normal operation and the data presented to the multiplexer 113 during a random access operation. In one embodiment, the select signal (CE2#) goes low to select the random access data.

In one embodiment, the select signal is a second chip select signal (CE2#) that is active low to select the input parallel address and high to select the address counter value. Alternate embodiments, however, use other select mechanisms and/or other select signal states. For example, the command latch enable (CLE) and address latch enable (ALE) lines might be high during a random access operation.

The "random access" function of the present invention refers to an access that may or may not be sequential in nature. The order of access depends upon the instruction being executed and is not limited to simply a serial, sequence of addresses.

Figure 2:
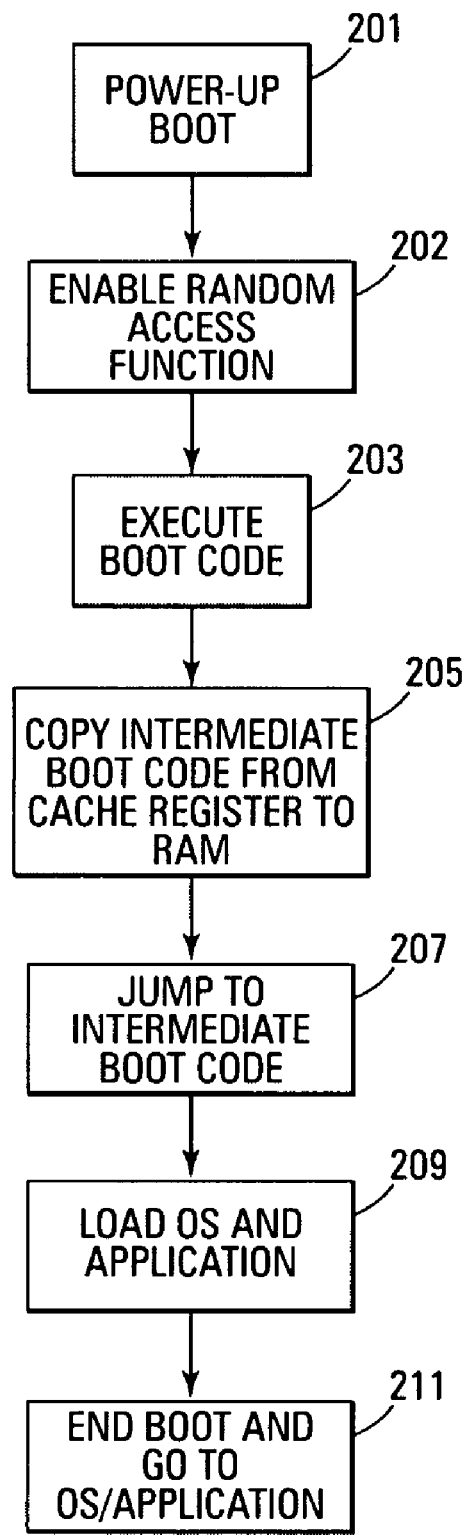
FIG. 2 shows a flowchart of one embodiment of a method for using the memory device of the present invention in a boot memory application.

FIG. 2 illustrates a flowchart of one embodiment of a method for using the NAND flash memory of the present invention in a boot memory application. The method starts when a power-up boot occurs 201. This is typically when power is applied to the memory device power pins.

The random access mode is enabled 202 so that the accessing controller/processor can access the cache register as it would a ROM. The code that has been loaded into the cache register, in one embodiment, is the boot code that is stored in the first row of the memory array and used to initialize the processor, memory, and/or other components of a computer system.

The processor executes the initial boot code in the cache register 203 as it reads each word from the data multiplexer. The random access interface of the present invention enables the processor to have this access.

Intermediate boot code is copied from the cache register and stored in another memory device, such as RAM 205. In one embodiment, the intermediate boot code is also a portion of the first row of boot code.

A jump is then made to the intermediate boot code image in RAM 207. This code is executed to perform the remaining boot-up tasks that are normally required by a boot routine such as loading of the operating system and/or other applications to RAM. Boot routines are well known in the art and are not discussed further.

The operating system and any start-up applications are loaded from the NAND memory 209. In an alternate embodiment, only additional applications are loaded without the operating system. After the required applications have been loaded into RAM, the boot process has ended and a jump is made to the operating system and/or relevant applications 211.

Figure 3:
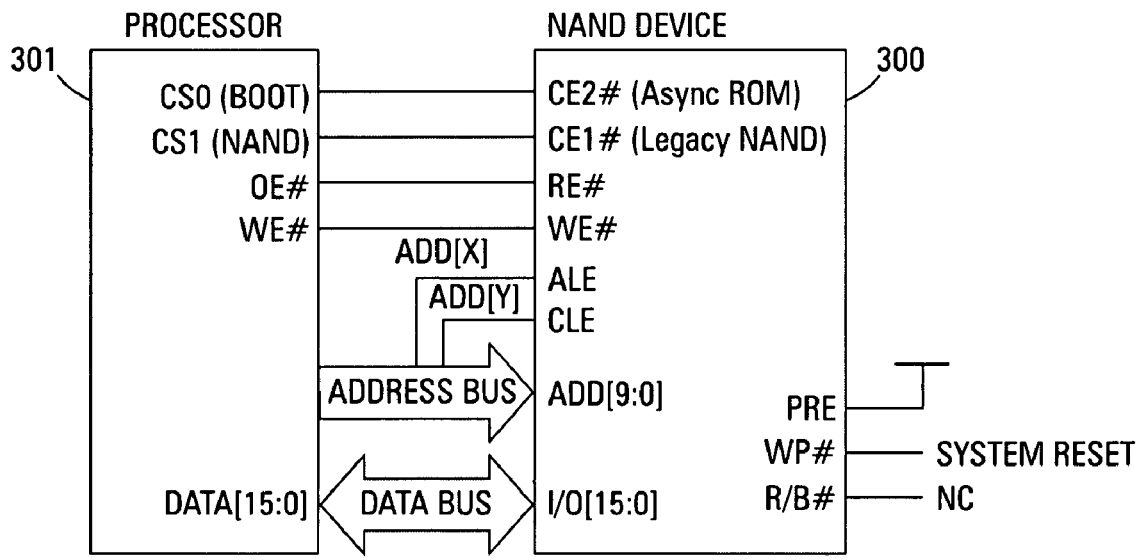
FIG. 3 shows a block diagram of one embodiment of an embedded memory device of the present invention in an electronic system.
Figure 4:
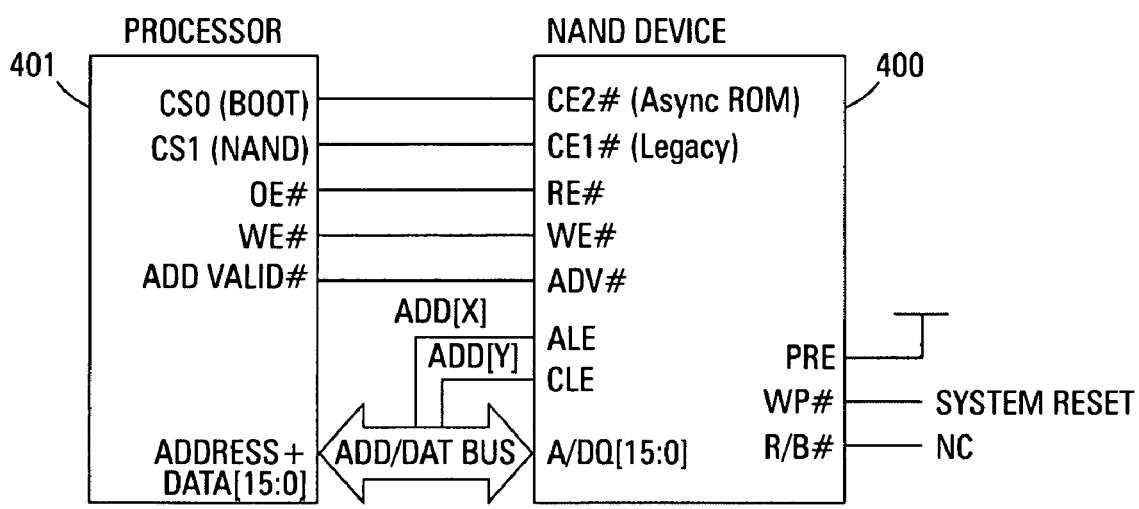
FIG. 4 shows a block diagram of another embodiment of an embedded memory device of the present invention in an electronic system.

FIGS. 3 and 4 illustrate the NAND memory device of the present invention as embedded memory devices with a processor or controller circuit. In alternate embodiments, these figures could show the memory device as an integrated circuit in an electronic system with a processor. In other alternate embodiments, the NAND memory device is any other memory device that would benefit from the random access interface of the present invention. Such memory devices may include other types of non-volatile memory. The present invention is not limited to any one type of non-volatile memory technology.

FIG. 3 illustrates a block diagram of one embodiment of an embedded NAND memory of the present invention in an electronic or computer system. This embodiment uses a separate address bus to access the cache register as described previously.

The system of FIG. 3 is comprised of a processor 301, microcontroller, or some other type of controller circuit. One embodiment of the NAND memory device 300 has been described previously. The processor 301 generates the chip enable signals (CE1# and CE2#) using chip select outputs CS0 and CS1. The CS0 output is coupled to the CE2# input of the memory device 300 and enables the random access function of the present invention. The CS1 output is coupled to the CE1# input of the memory device 300 and enables the memory device 300 as a normal chip enable signal that is well known in the art.

The output enable (OE#) and write enable (WE#) signals are coupled to the memory device's read enable (RE#) and write enable (WE#) inputs, respectively. A bidirectional data bus is coupled between the processor 301 and memory device 300.

The address bus from the processor 301 is input to the parallel address input of the address multiplexer of the present invention. Additionally, two of the address bus signals are input to the address latch enable (ALE) and command latch enable (CLE) inputs, whose functions are well known in the art for writing addresses and commands to the memory device 300. While the parallel address bus input to the memory device 300 is shown as being a ten-bit address bus, alternate embodiments may use larger or smaller address buses, depending on the memory device size. The serial address bus used to access the remainder of the memory array is not shown and is also well known in the art.

FIG. 4 illustrates a block diagram of another embodiment of the embedded NAND memory of the present invention in an electronic system. The connections between the memory device 400 and the processor 401 are substantially similar to the embodiment of FIG. 3 except that this embodiment uses a multiplexed address/data bus. In this embodiment, an address valid strobe (ADV#) is included to latch the external parallel address into the memory device 400.

The embodiment of FIG. 3 typically requires an additional 11 (word wide) or 12 (byte wide) pads to incorporate the random access boot ROM functionality of the present invention. The embodiment of FIG. 4 requires only an additional two pads for the same functionality.

FIGS. 5 and 6 illustrate the read and write timing, respectively, for the multiplexing of the address and data buses for the asynchronous ROM interface NAND flash memory of the present invention. These timing diagrams are for purposes of illustration only. The signals of the present invention are not limited to any one configuration.

In the read embodiment of FIG. 5, the CE# signal goes low to access the memory device. The WE# signal is high throughout the read operation. The ADV# goes low when the address on the multiplexed address/DQ bus is valid in order to latch in this address. In order to output on this bus, the OE# signal goes low. These asynchronous read operations to the cache register are possible at any time, not just at power-up.

In the write embodiment of FIG. 6, the CE# signal goes low to access the memory device. The OE# signal is high throughout the write operation. The ADV# goes low when the address on the multiplexed address/DQ bus is valid and returns high in order to latch in this address. When the data input on this bus is valid for writing, the WE# signal strobes the data into memory. The embodiments of the present invention provide for asynchronous write operations into the data register.

Figure 7:
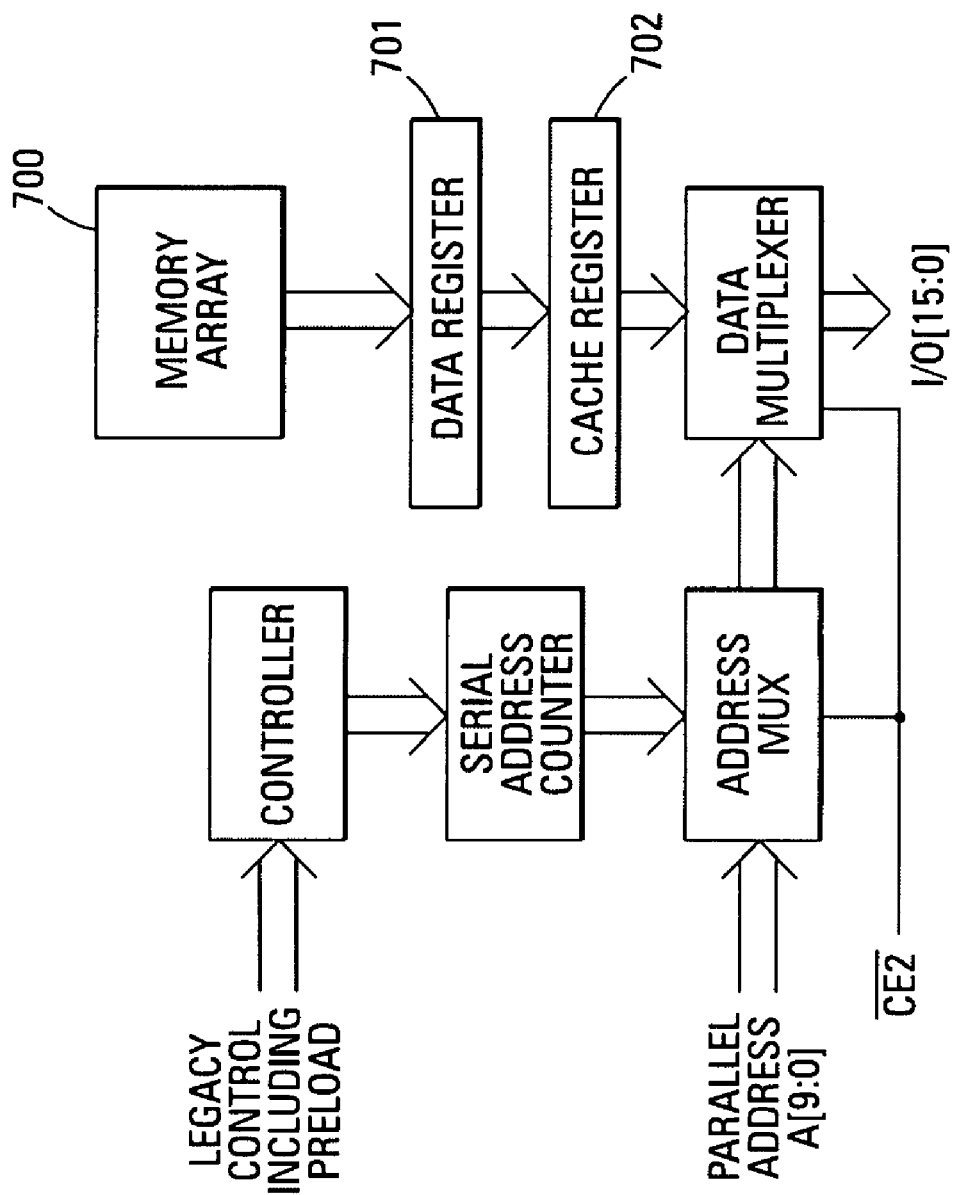
FIG. 7 shows a block diagram of an alternate embodiment of a memory device of the present invention having a random access interface.

FIG. 7 illustrates a block diagram of an alternate embodiment of a NAND flash memory having a random access interface of the present invention. This embodiment separates the data register 701 and cache register 702. By separating these registers 701 and 702, the memory array 700 is accessible while the code in the cache register 702 is being executed. This provides one way to speed up processor operations since execution of the cache register code does not have to be completed prior to accessing additional code in NAND memory.

The present invention is not limited to any one data/cache register architecture. Alternate embodiments may use only a data or a cache register in place of both the data and cache registers discussed above. In still other embodiments, the data and cache registers are a part of the data multiplexer.

CONCLUSION

In summary, the memory device of the present invention provides an asynchronous random interface to a serial memory array. This can reduce the price of embedded memory systems by eliminating the more expensive NOR legacy boot flash memory typically used in the prior art.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
    a memory array having stored data and a serial output;
    an address counter that generates a serial address signal that sequentially generates addresses corresponding to stored data in the memory array;
    an address multiplexer having a first input coupled to an external address bus and a second input coupled to the serial address signal, the address multiplexer selecting either the first or second inputs in response to a state of a select signal; and
    a data multiplexer coupled to receive stored data from the memory array and an input address from the address multiplexer, the data multiplexer adapted to output either randomly accessed stored data or sequentially accessed stored data in response to the input address and state of the select signal.

2. The memory device of claim 1 wherein the data multiplexer further comprises a register to receive the stored data.

3. The memory device of claim 2 wherein the register further comprises a data register and a cache register.

4. The memory device of claim 3 wherein the register is adapted to concurrently allow the data register to receive stored data from the memory array and the data multiplexer to access data stored in the cache register.

5. The memory device of claim 4 wherein data accessed from the cache register is different than data concurrently received by the data register.

6. The memory device of claim 1 wherein the output of the data multiplexer further comprises a data bus.

7. The memory device of claim 6 wherein the data bus is a 16 bit data bus.

8. The memory device of claim 6 wherein the address bus coupled to the first input is multiplexed with the data bus output of the data multiplexer.

9. The memory device of claim 2 wherein the memory array further comprises a first row of data.

10. The memory device of claim 9 wherein the register is capable of storing the entire first row of data at one time.

11. The memory device of claim 1 further comprising a controller circuit to control operation of the memory device.

12. A memory device comprising:
    a memory array having a serial output;
    a data register, coupled to the memory array, for receiving data from the memory array;
    an address counter that generates a serial address signal that sequentially generates addresses corresponding to data stored in the memory array;
    an address multiplexer having a first input coupled to a random access external address bus and a second input coupled to the serial address signal, the address multiplexer selecting either the first or second inputs in response to a state of a select signal; and a data multiplexer coupled to receive data from the data register and an input address from the address multiplexer, the data multiplexer capable of accepting either randomly accessed stored data or sequentially accessed stored data from the data register in response to the input address and state of the select signal.

13. The memory device of claim 12 wherein the random access external address bus is a parallel address bus.

14. The memory device of claim 13 wherein the random access external address bus is a 10 bit address bus.

15. The memory device of claim 12 further comprising a controller circuit adapted to generate control signals for controlling the operation of the memory device.

16. The memory device of claim 12 further comprising a first row of data of the memory array.

17. The memory device of claim 16 wherein the data register is capable of storing the entire first row of data of the memory array.

18. A method for accessing data stored in a memory device in a sequential or a random access manner, the memory device having an array of non-volatile memory cells and adapted to internally generate serial memory addresses and receive externally generated random access memory addresses, the method comprising:

loading a predetermined segment of the non-volatile memory array into a register;

generating a plurality of serial addresses;

selecting an address from either the plurality of serial addresses or an externally provided random access memory address; and accessing the register with the selected address such that when the externally provided random access memory address is the selected address, the register is accessed in a non-sequential manner.

19. The method of claim 18 wherein the predetermined segment of non-volatile memory comprises boot code data.

* * * * *